United States Patent
Jerger et al.

(10) Patent No.: US 11,404,990 B2
(45) Date of Patent: Aug. 2, 2022

(54) METHOD FOR OPERATING AN ELECTRIC SYNCHRONOUS MACHINE

(71) Applicant: Robert Bosch GmbH, Stuttgart (DE)

(72) Inventors: Armin Jerger, Sinzheim (DE); Markus Becker, Oppenau (DE); Ulrich Vollmer, Weilheim (DE)

(73) Assignee: Robert Bosch GmbH, Stuttgart (DE)

( * ) Notice: Subject to any disclaimer, the term of this patent is extended or adjusted under 35 U.S.C. 154(b) by 10 days.

(21) Appl. No.: 16/960,123

(22) PCT Filed: Dec. 17, 2018

(86) PCT No.: PCT/EP2018/085261
§ 371 (c)(1),
(2) Date: Jul. 6, 2020

(87) PCT Pub. No.: WO2019/134816
PCT Pub. Date: Jul. 11, 2019

(65) Prior Publication Data
US 2021/0075358 A1 Mar. 11, 2021

(30) Foreign Application Priority Data
Jan. 4, 2018 (DE) .................. 10 2018 200 085.9

(51) Int. Cl.
*H02M 1/08* (2006.01)
*H02P 27/08* (2006.01)
(Continued)

(52) U.S. Cl.
CPC ............ *H02P 27/08* (2013.01); *H02P 25/022* (2013.01); *G01R 19/0092* (2013.01)

(58) Field of Classification Search
CPC ... H02P 27/08; H02P 25/022; G01R 19/0092; H02M 1/0009; H02M 7/5395
See application file for complete search history.

(56) References Cited

U.S. PATENT DOCUMENTS

2008/0088300 A1* 4/2008 Koelle .................. G01R 1/203
324/156
2013/0335100 A1* 12/2013 Boehm .................. G01R 35/00
324/537
(Continued)

FOREIGN PATENT DOCUMENTS

DE 102005062759 7/2007
DE 102011003897 8/2012
(Continued)

OTHER PUBLICATIONS

International Search Report for Application No. PCT/EP2018/085261 dated Apr. 2, 2019 (English Translation, 2 pages).

*Primary Examiner* — Muhammad S Islam
(74) *Attorney, Agent, or Firm* — Michael Best & Friedrich LLP

(57) ABSTRACT

The invention relates to a method for operating an electric synchronous machine, having the steps of: —generating centered pulse-width-modulated switching signals for switching elements (T1 . . . T6) of half-bridges, wherein two switching elements (T1 . . . T6) are connected to a respective half-bridge in each case; second switching elements (T4 . . . T6) of each half-bridge are actuated in a complementary manner to the first switching elements (T1 . . . T3) of each half-bridge if a sufficient minimum measurement duration ($T_M$) is thereby provided during which the switching signals of switching elements (T1 . . . T6) of two half-bridges lie at different potentials; —otherwise: —generating pulse-width-modulated switching signals for the switching elements (T1 . . . T6) of the half-bridges, said switching signals deviating from the center at least to such a degree that a sufficient minimum measurement duration ($T_M$) is provided, wherein —the switching signals of the switching elements (T1 . . . T6) are designed such that temporal changes corresponding to the minimum measure- (Continued)

ment duration (TM) in the switching signals of the switching elements (T1 . . . T6) are prevented; and —carrying out a 1-shunt current measurement within the provided minimum measurement duration $T_M$).

10 Claims, 7 Drawing Sheets

(51) Int. Cl.
*H02P 25/022* (2016.01)
*G01R 19/00* (2006.01)

(56) References Cited

U.S. PATENT DOCUMENTS

| | | | |
|---|---|---|---|
| 2015/0365026 | A1 | 12/2015 | Schock et al. |
| 2016/0356817 | A1* | 12/2016 | Sievert ............... G01R 19/0092 |
| 2017/0201190 | A1* | 7/2017 | Schenk ............. H02M 7/53871 |

FOREIGN PATENT DOCUMENTS

| | | |
|---|---|---|
| DE | 102014217585 A1 | 3/2015 |
| DE | 102014217588 A1 | 3/2015 |
| DE | 102015202693 | 9/2015 |
| DE | 102014018431 A1 | 6/2016 |

\* cited by examiner

METHOD FOR OPERATING AN ELECTRIC SYNCHRONOUS MACHINE

BACKGROUND OF THE INVENTION

The invention relates to a method for operating an electric synchronous machine. The invention further relates to a device for operating an electric synchronous machine. The invention further relates to a computer program product.

Applications of permanently excited synchronous machines are known as drives for fans, for example radiator fans in the automotive industry. Furthermore, sensorless regulation of synchronous machines is known, i.e. regulation without using a rotor position sensor. The rotor position is then determined from the induced electric voltage (BEMF, back electromotive force, electromotive force EMF) of the synchronous machine.

In many cases, knowledge of electrical phase currents of synchronous machines is essential for controlling or regulating electric synchronous machines. The electrical phase currents are required as an input variable for methods for sensorless rotor angle estimation or for regulation methods, for example.

In a cost-effective solution, the electrical phase currents are determined via only one shunt in the common ground path or supply path of half bridges ("1-shunt current measurement").

DE 10 2015 202 693 A1 discloses a method for determining line current in an electric multi-phase system.

SUMMARY OF THE INVENTION

One object of the present invention is to provide a method for operating a synchronous machine in an improved manner.

The object is achieved according to a first aspect with a method for operating an electric synchronous machine, having the steps:

generating centered pulse-width-modulated switching signals for switching elements of half bridges, wherein in each case two of the switching elements are connected to one half bridge, wherein second switching elements of each half bridge are controlled in a complementary manner to first switching elements of each half bridge if a sufficient minimum measurement duration is therefore provided during which the switching signals of switching elements of two half bridges are at different potentials;

otherwise:

generating pulse-width-modulated switching signals for the switching elements of the half bridges which deviate at least so far from the centering that a sufficient minimum measurement duration is provided, wherein the switching signals of the switching elements are formed in such a way as to avoid time jumps corresponding to the minimum measurement duration in the switching signals of the switching elements; and carrying out a 1-shunt current measurement within the minimum measurement duration provided.

In this way, noise-optimized operation of the synchronous machine, which is regulated in a sensorless manner, can be achieved with specifically non-centered control signals, since time jumps around the measurement duration in the phase signals are avoided.

The object is achieved according to a second aspect with a device for operating an electric synchronous machine, having:

a generating means for generating centered pulse-width-modulated switching signals for switching elements of half bridges, wherein in each case two of the switching elements are connected to one half bridge, wherein second switching elements of each half bridge are controlled in a complementary manner to first switching elements of each half bridge if a sufficient minimum measurement duration is therefore provided during which the switching signals of switching elements of two half bridges are at different potentials, otherwise: for generating pulse-width-modulated switching signals for the switching elements of the half bridges which deviate at least so far from the centering that a sufficient minimum measurement duration is provided;

wherein, by means of the generating means, the switching signals of the switching elements can be formed in such a way as to avoid time jumps in the switching signals of the switching elements corresponding to the minimum measurement duration; and a measuring means for carrying out a 1-shunt current measurement, wherein, by means of the switching signals of the switching elements, a defined minimum measurement duration is provided during which two switching signals of a half bridge are at different potentials.

One preferred development of the method envisages that in the event that the switching signals of the first switching elements have a defined similar duty cycle, rising edges of the three switching signals of the first switching elements, at which the 1-shunt current measurement is carried out, are fixed in their chronological sequence relative to one another and are formed in such a way that the minimum measurement duration is provided between the switching signals of the first switching elements, wherein the 1-shunt current measurement is carried out at rising edges of the switching signals of the first switching elements in the first half of the PWM period. In this way, a scenario is taken into account during operation of the synchronous machine in which low motor power or motor speed is realized owing to minor differences in the duty cycles.

One further preferred development of the method is characterized in that in the event that the switching signals of the first switching elements have a defined similar duty cycle, falling edges of the three switching signals of the first switching elements, at which the 1-shunt current measurement is carried out, are fixed in their chronological sequence relative to one another and are formed in such a way that the minimum measurement duration is provided between the switching signals of the first switching elements, wherein the 1-shunt current measurement is carried out at falling edges of the switching signals of the first switching elements in the second half of the PWM period. In this way, a similar scenario to that described above is provided for the synchronous machine, wherein in this case the 1-shunt current measurement is carried out at falling edges of the switching signals.

One further preferred embodiment of the method is characterized in that the duty cycles of the three switching signals of the switching elements are similar and the difference in the duty cycles of the three switching signals is preferably smaller than approximately 20% up to approximately 30%. In this way, the method can be used for a plurality of different formations of the switching signals. Preferably, the differences in the duty cycles of the three switching signals is therefore small (i.e. up to approximately 20-30% differences in the duty cycles) or the electric voltage amplitude of the motor ("total duty cycle") is a maximum of approximately 20-30%. In this case, an absolute value of the duty cycles of the three switching signals is advantageously irrelevant, for example the three duty cycles could be 60% or 70% or 80% and in such cases the method would advantageously also function, since the maximum difference between the duty cycles would only be 20%.

One further preferred embodiment of the method is characterized in that in the event that at least two switching signals of the first switching elements have a defined largely different duty cycle, wherein the difference in the duty cycle is greater than approximately 25% up to approximately 100%, in the event that the proportions of the switching signals change during a transition from one switching cycle to the next, the switching signals are formed in such a way that the 1-shunt current measurements are in each case carried out at alternating edges of the switching signals. In this case, a scenario is covered during operation of the synchronous machine in which high electric motor voltages occur owing to great differences in the duty cycles of the control signals. Even in this case, the synchronous machine can be operated in a very noiseless manner.

One further preferred embodiment of the invention envisages that the method is carried out for a permanently excited or for a separately excited synchronous machine. In this way, the method can advantageously be used for synchronous machines which are structurally different.

The invention is described in detail hereinafter with further features and advantages using a plurality of figures. Identical or functionally identical elements have identical reference symbols therein. The figures are in particular intended to illustrate the principles which are essential to the invention.

Disclosed features of the device are derived analogously from corresponding disclosed features of the method, and vice versa. In particular, this means that features, technical advantages and formations relating to the method for operating an electric synchronous machine are derived from corresponding formations, features and technical advantages relating to the device for operating an electric synchronous machine, and vice versa.

DETAILED DESCRIPTION

Figure 1:
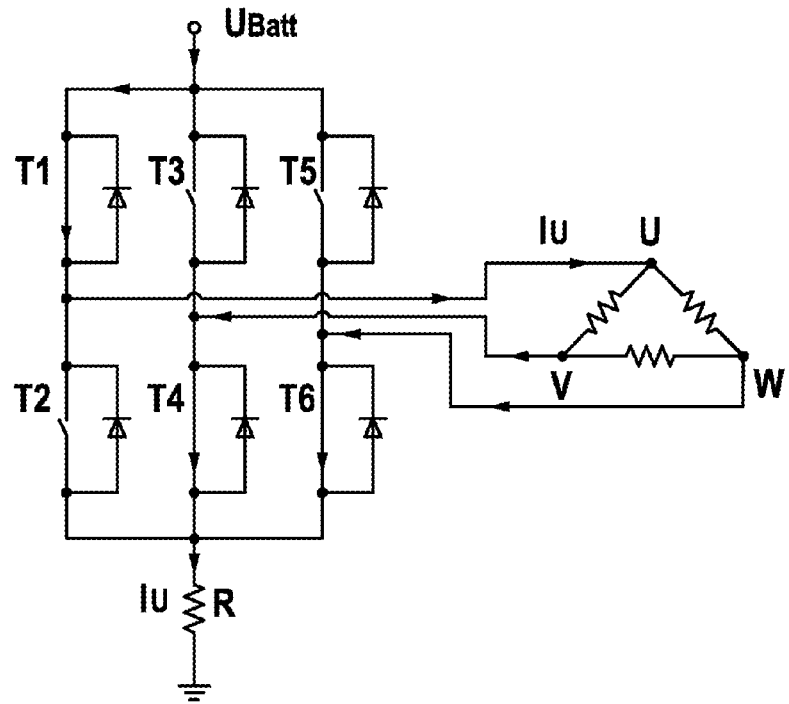
FIGS. 1 and 2 show principle representations for explaining a mode of operation of a conventional 1-shunt current measurement of an electric synchronous machine.

FIG. 1 shows a principle circuit diagram of a conventional device for operating an electric synchronous machine, wherein the synchronous machine is controlled by means of pulse-width-modulated electric control signals. The device preferably comprises three half bridges with switching elements T1 . . . T6 which generate said control signals for phase windings of the synchronous machine.

This is represented in an exemplary manner hereinafter for a 3-phase system with the three phase connections U, V, W and a B6-bridge configuration with three half bridges T1-T2, T3-T4, T5-T6 or a shunt R in the ground path of the half bridges.

Figure 2:
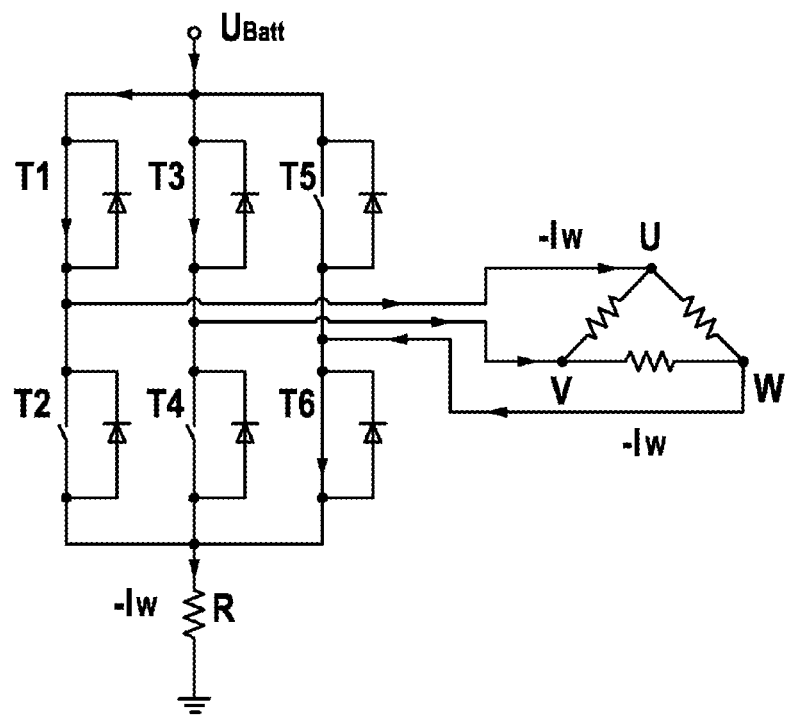

In order to be able to extrapolate from the electrical shunt current $I_R$ to the three phase currents, the six electronic switching elements T1 . . . T6 of the B6-bridge must have a defined switching pattern. For example, in the switching pattern 1 from FIG. 1, the electrical shunt current $I_R$ corresponds to the phase current U. In the switching pattern 2 from FIG. 2, the electrical shunt current $I_R$ corresponds to the negative electrical phase current W.

Generating the three electric phase voltages U, V and W typically takes place by means of pulse width modulation (PWM), wherein centered PWM control signals are preferably, but not exclusively, used for this purpose.

Figure 3:
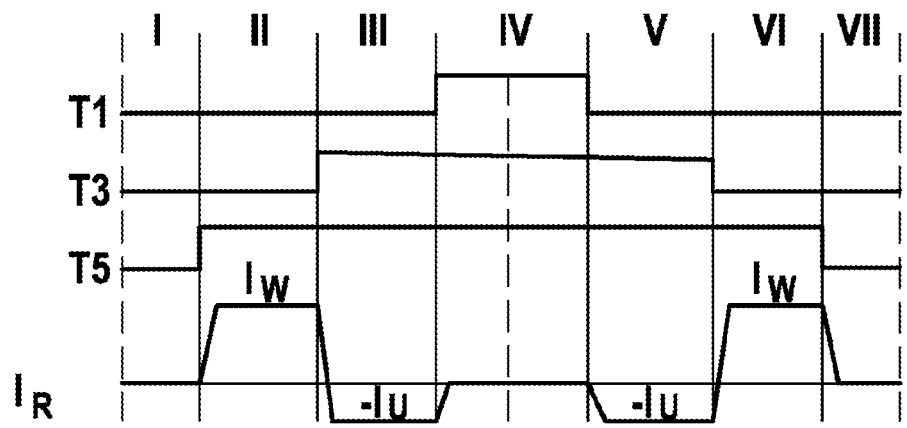
FIGS. 3-5 show principle signal diagrams for explaining a mode of operation for operating an electric synchronous machine.

FIG. 3 shows an example for a switching pattern of the three high-side switches T1, T3, T5 during a PWM period with centered PWM generation as well as the resulting electrical shunt current $I_R$. In order to be able to determine the three electrical phase currents during a PWM period, the electrical shunt current $I_R$ must be detected in two different switch positions (one of the three high-side switches closed or two of the three high-side switches closed). In the example in FIG. 3, this would be possible in zones II and III or in zones V and VI. As a result, two of the three electrical phase currents can be directly determined via a measurement of the shunt current $I_R$, wherein the third electrical phase current can then be calculated by means of the electrical node rule.

Figure 4:
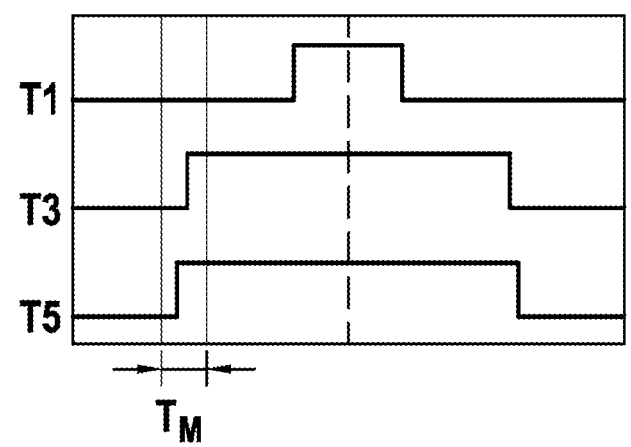

In order to detect the electrical shunt current $I_R$ in a metrological manner, the two switching patterns (one of the three high-side switches T1, T3, T5 closed or two of the three high-side switches T1, T3, T5 closed) must be present for a minimum duration. If the duty cycles on at least two of the three phases are similar, a 1-shunt current measurement is thus not possible without further measures being taken. In the following example, a 1-shunt current measurement would not be possible, since the duty cycles on the switching elements T3 and T5 are too similar, as is recognizable in FIG. 4.

Figure 5:
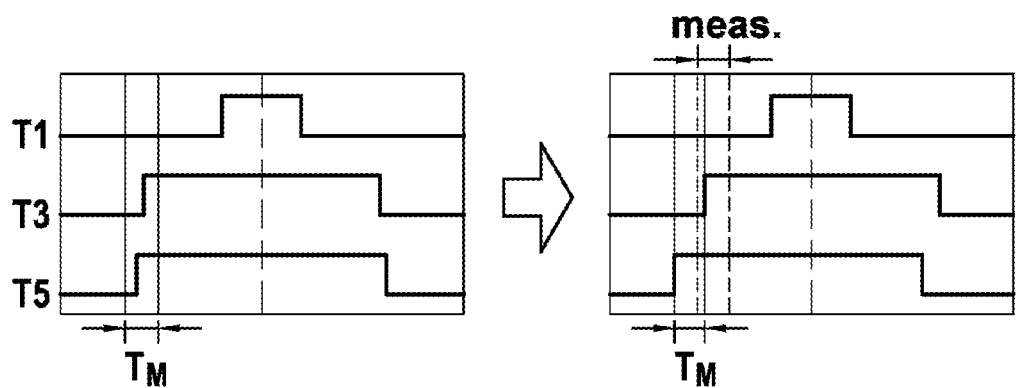

In order to make a 1-shunt current measurement possible even in cases such as these, the two switching edges on at least one of the three half bridges T1-T2, T3-T4, T5-T6 must be temporally shifted. In the following example, it is possible to determine the phase currents by means of the 1-shunt current measurement after shifting the switching edges on the switching elements T3, T5, as is recognizable in FIG. 5.

Figure 6:
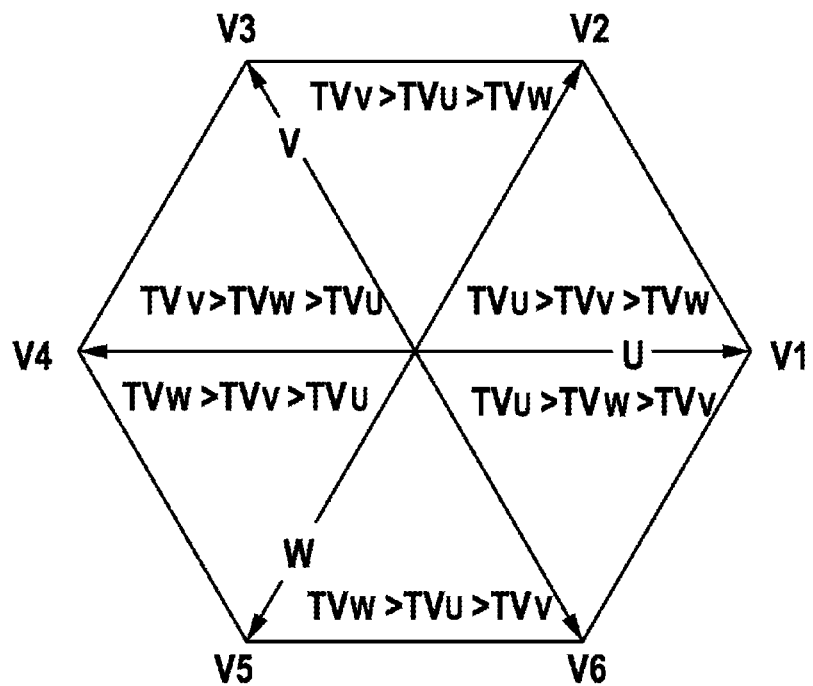
FIG. 6 shows a representation for explaining sector changes during operation of an electric synchronous machine.

The direction in which the edges of the PWM switching signals are shifted is typically determined based on the proportion of the duty cycles on the three phases. FIG. 6 shows the proportion of the duty cycles on the three phases U, V, W using a vector diagram. The direction in which the switching signals are shifted is typically also changed during a so-called "sector change". However, the sector change results in a jump in the position of the switching edges in the length of the minimum measurement duration $T_M$ and, as a result, an often undesired jump in the electrical phase current paths. Depending on the application, these jumps in the electrical phase currents can be critical concerning a noise characteristic of the application with the electric synchronous machine.

Figure 7:
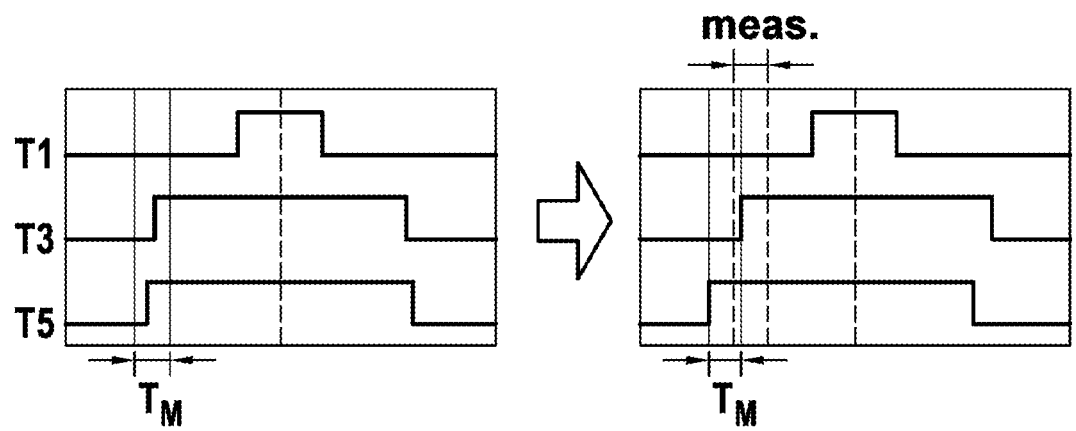
FIGS. 7-8 show time diagrams with control signals according to a conventional method for operating an electric synchronous machine.

The following example from FIG. 7 shows the resulting switching patterns before and after a sector change, wherein before the sector change the condition is:

$$TV_W > TV_V > TV_U$$

with:
TV$_W$ . . . duty cycle W
TV$_V$ . . . duty cycle V
TV$_U$ . . . duty cycle U
and after the sector change the condition is:

$$TV_V > TV_W > TV_U$$

Owing to the jumps of the switching signals generated in this way around a minimum measurement duration $T_M$ in each case, a changing phase current is generated with an undesired noise level caused by this.

It is therefore proposed that the phases of the switching signals be arranged in such a way that said jumps no longer occur.

Figure 9:
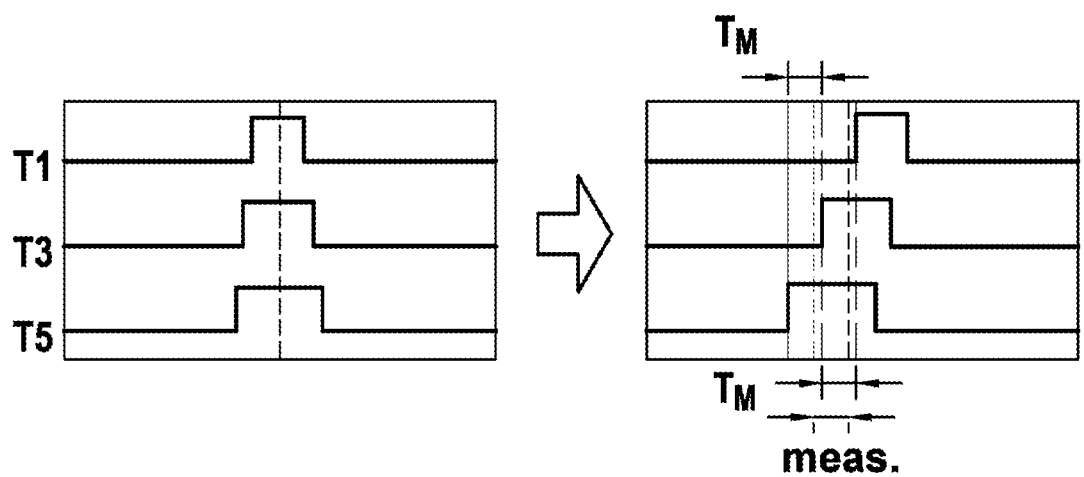
FIGS. 9-10 show a principle representation of a first embodiment of a method for operating an electric synchronous machine.

The right representation in FIG. 9 shows a first embodiment of the proposed method, the left representation represents the switching signals without modifications according to the invention. One recognizes that the duty cycles of the three switching signals are similar, wherein the difference in the duty cycles of the three switching signals is preferably smaller than approximately 20% up to approximately 30%. In this case, the rising edges of the three switching signals are fixedly positioned during a sector change, so that the minimum measurement duration $T_M$ is provided for carrying out the 1-shunt current measurement.

Figure 10:
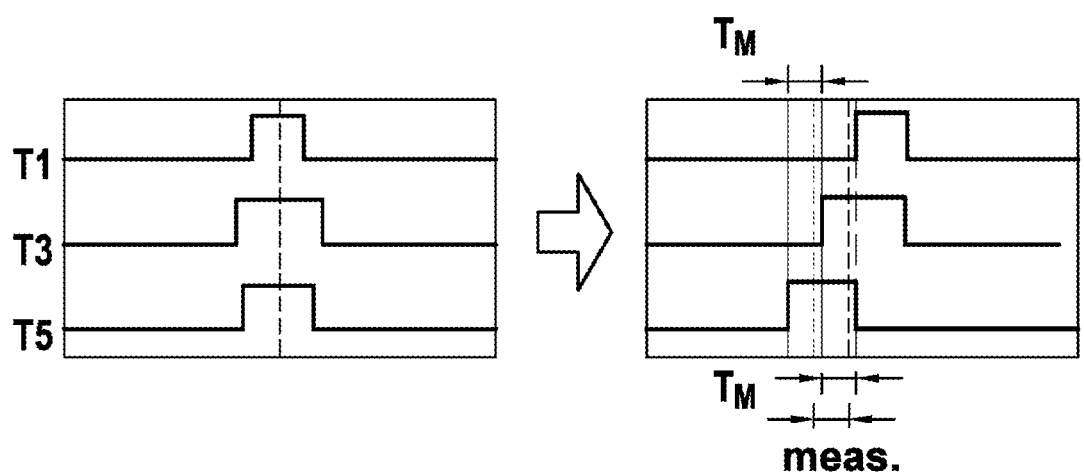

This is also the case in the right representation in FIG. 10, in which the edges within the individual switching signals only marginally change and, as a result, the synchronous machine is run more quietly in terms of noise. This results in the three switching signals no longer being centered in the right representations of FIGS. 9 and 10.

Figure 8:
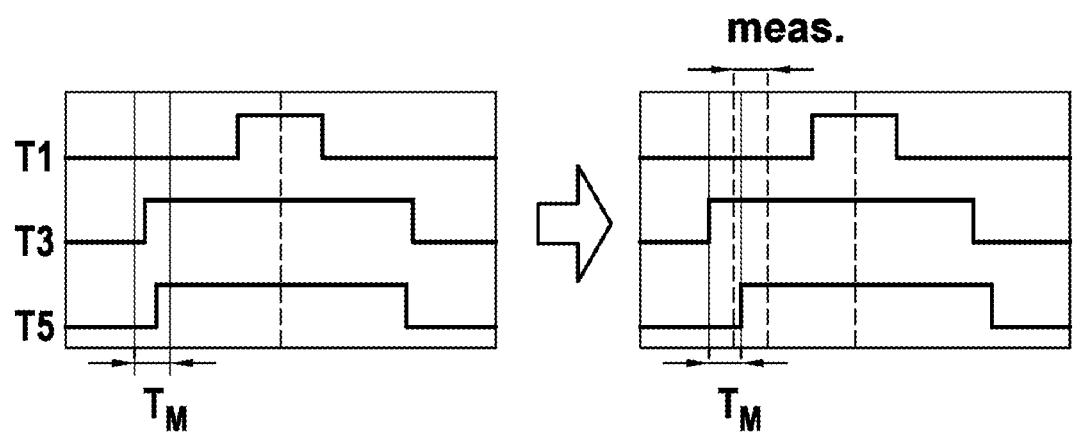

The same sector change is realized from FIG. 9 to FIG. 10 as in the conventional method from FIG. 7 to FIG. 8.

Not represented in the figures is the case in which said fixing of the switching signals is based on the falling edges of the signals, so that even in this case no significant, noise-causing jumps occur within the individual PWM switching signals.

Figure 11:
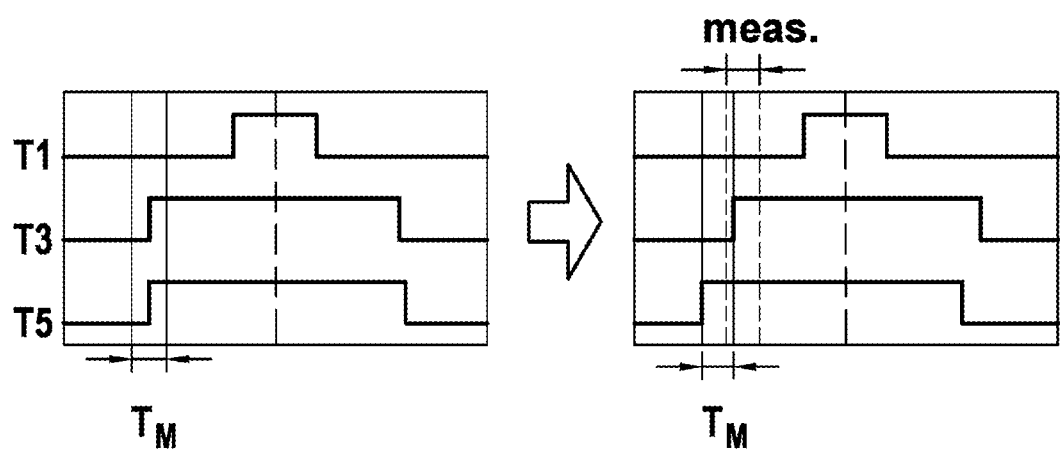
FIGS. 11-12 show a principle representation of a further embodiment of a method for operating an electric synchronous machine.
Figure 12:
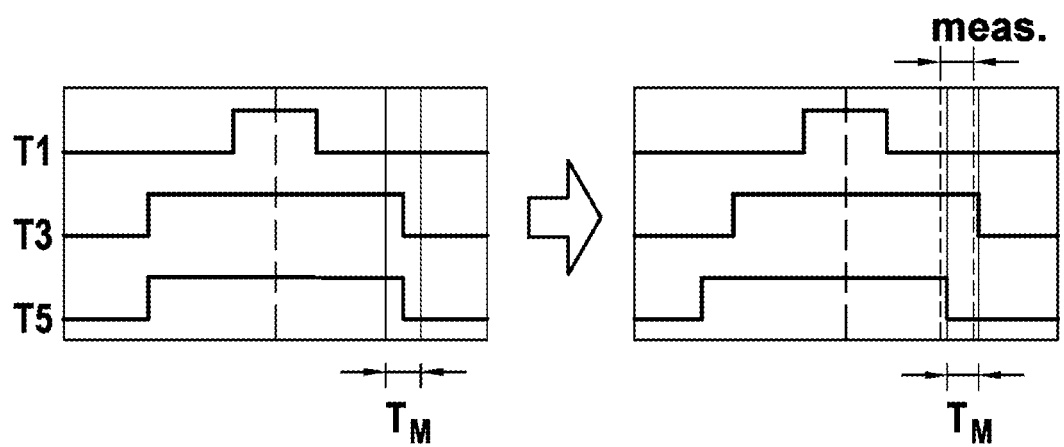

FIG. 11 and FIG. 12 shows one further embodiment of the proposed method, wherein in this case there is a large difference between the duty cycles of at least two PWM switching signals, such that the method from FIG. 9 and FIG. 10 would not be applicable. In this case, during the sector change, i.e. during a transition from FIG. 11 to FIG. 12, the PWM switching signals are formed or arranged in such a way that the measurement is carried out once at the rising edges (right representation of FIG. 11) or after the sector change at the falling edges (right representation of FIG. 12) alternately. It is also recognizable in this case that the switching signals do not have any significant jumps according to the right representations, and a quiet phase current path is generated as a result.

As a result, the three switching signals in the right representations of FIGS. 11 and 12 are also defined as deviating from being centered in this variant.

As a result, this corresponds to an embodiment which is used in particular for medium and high electric voltage amplitudes of the motor, although wherein the position of the switching edges is shifted according to the proportion of the duty cycles on the three half bridges, if no 1-shunt current measurement would be possible with the original (unchanged) switching patterns.

In this case, during each sector change, a measurement of the shunt current $I_R$ on the positive switching edges or on the negative switching edges is carried out. The position of the switching edges during the sector change remains unchanged owing to this process, whereby jumps in the switching edges and thus in the phase current paths are advantageously avoided.

If, when measuring the electrical shunt current $I_R$ on the positive switching edges, two switching signals from different phases have a similar duty cycle, the switching signals on the phase with the larger duty cycle are shifted to the left, the switching signals on the phase with the smaller duty cycle are shifted to the right. If, when measuring the electrical shunt current $I_R$ on the negative switching edges, two phases have a similar duty cycle, the switching signals on the phase with the larger duty cycle are shifted to the right, the switching signals on the phase with the smaller duty cycle are shifted to the left.

In the following example according to FIG. 12, during the sector change:

$$TV_W > TV_V > TV_U$$

is changed from a measurement of the phase current on the positive switching edges to a measurement of the phase current on the negative switching edges. In this case, the position of the switching edges remains unchanged.

Advantageously, the proposed method does not require any additional hardware, but can be implemented exclusively by software, wherein suitable algorithms are programmatically stored in a microcontroller. As a result, the method can be adapted or modified in a simple manner.

Advantageously, the proposed method can be realized in permanently excited and also in separately excited synchronous machines.

In the process, the proposed method was described by way of example using a three-phase synchronous machine, however it is indicated that the proposed method can also be used for one-phase, two-phase, four-phase, five-phase and multi-phase synchronous machines.

In the process, the proposed method was described by way of example using the high-side switches T1, T3, T5. However, it is self-evident that an embodiment of the method is also possible by means of the low-side switches T2, T4, T6.

Figure 13:
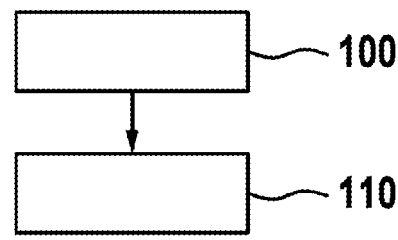
FIG. 13 shows a flow diagram of a proposed method for operating an electric synchronous machine.

FIG. 13 shows a principle execution of a proposed method for operating an electric synchronous machine.

In one step 100, centered pulse-width-modulated switching signals for switching elements T1 . . . T6 of half bridges are generated, wherein in each case two of the switching elements T1 . . . T6 are connected to one half bridge, wherein second switching elements T4 . . . T6 of each half bridge are controlled in a complementary manner to first switching elements T1 . . . T3 of each half bridge if a sufficient minimum measurement duration $T_M$ is therefore provided during which the switching signals of switching elements T1 . . . T6 of two half bridges are at different potentials.

Otherwise, in one step 110, pulse-width-modulated switching signals for the switching elements T1 . . . T6 of the half bridges are generated which deviate at least so far from the centering that a sufficient minimum measurement duration $T_M$ is provided, wherein the switching signals of the switching elements T1 . . . T6 are formed in such a way as to avoid time jumps corresponding to the minimum measurement duration $T_M$ in the switching signals of the switching elements T1 . . . T6, and wherein a 1-shunt current measurement is carried out within the minimum measurement duration $T_M$ provided.

Figure 14:
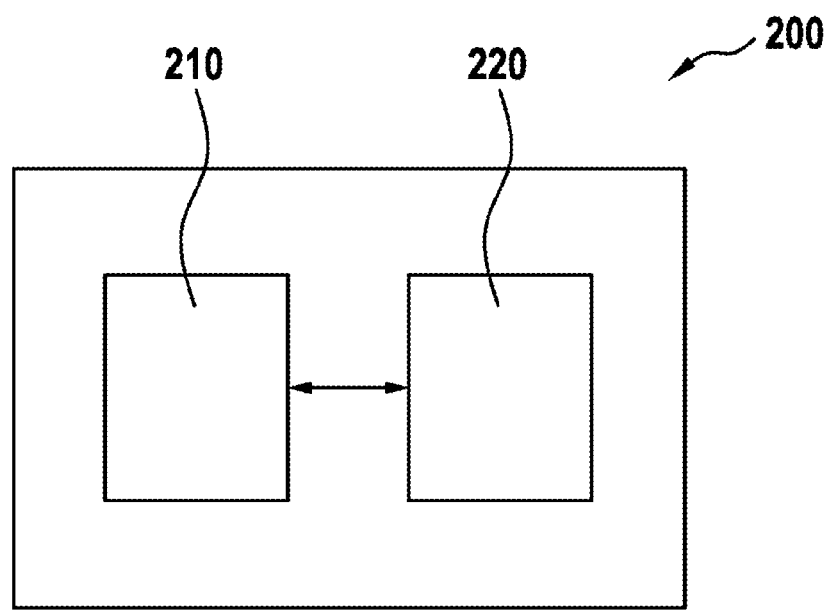
FIG. 14 shows a principle block diagram of a proposed device for operating an electric synchronous machine.

FIG. 14 shows a principle block diagram of a device 200 for operating an electric synchronous machine. A generating means 210 is recognizable for generating centered pulse-width-modulated switching signals for the switching elements T1 . . . T6 (not represented) of half bridges (not represented), wherein in each case two of the switching elements T1 . . . T6 are connected to one half bridge, wherein second switching elements T4 . . . T6 of each half bridge are controlled in a complementary manner to first switching elements T1 . . . T3 of each half bridge. The generating means is connected in a functional manner to a measuring means 220 for carrying out a 1-shunt current measurement, wherein, by means of the switching signals of the switching elements T1 . . . T6, a defined minimum measurement duration $T_M$ is provided during which two switching signals of a half bridge are at different potentials, wherein, by means of the generating means 210, the switching signals of the switching elements T1 . . . T6 can be formed in such a way as to avoid time jumps in the switching signals of the switching elements T1 . . . T6 corresponding to the minimum measurement duration $T_M$.

The person skilled in the art can also proceed to realize embodiments of the invention which have not been disclosed or have been only partially disclosed, without departing from the essence of the invention.

A time jump occurs when changing from one PWM clock to the next from a left shift to a right shift, or vice versa. Preferably, the switching signals should only change slightly from one PWM clock to the next, and should not have any large, i.e. time, jumps. In order to obtain sufficient measuring time, the switching signals are preferably shifted to the right or to the left deviating from the centering. In particular, changing from one PWM clock to the next from a left shift to a right shift, or vice versa, should be avoided.

The voltage indicator, which is generated by the three half bridges, is located within a hexagon according to FIG. 6. During operation of the electric synchronous machine, the voltage indicator usually rotates. A sector change means that the voltage indicator changes from one of the sectors of the hexagon into a different sector.

In methods which are known, during each sector change, the PWM shift is changed in two half bridges, one half bridge from left shift to right, the other half bridge in the opposite direction. In particular, this causes time jumps, noises, and is rectified by the invention.

A time jump occurs when changing from one PWM clock to the next from a left shift to a right shift, or vice versa. Preferably, the switching signals should only change slightly from one PWM clock to the next, and should not have any large, i.e. time, jumps. In order to obtain sufficient measuring time, the switching signals are preferably shifted to the right or to the left deviating from the centering. In particular, changing from one PWM clock to the next from a left shift to a right shift, or vice versa, should be avoided.

The voltage indicator, which is generated by the three half bridges, is located within a hexagon according to FIG. 6. During operation of the electric synchronous machine, the voltage indicator usually rotates. A sector change means that the voltage indicator changes from one of the sectors of the hexagon into a different sector.

In methods which are known, during each sector change, the PWM shift is changed in two half bridges, one half bridge from left shift to right, the other half bridge in the opposite direction. In particular, this causes time jumps, noises, and is rectified by the invention.

The invention claimed is:

1. A method for operating an electric synchronous machine, the method comprising:
generating centered pulse-width-modulated switching signals for switching elements (T1 . . . T6) of a plurality of half bridges, wherein in each case for each of the plurality of half bridges, a first switching element and a second switching element of the switching elements (T1 . . . T6) are connected to one half bridge, wherein the second switching elements (T4 . . . T6) of each one half bridge of the plurality of half bridges are controlled in a complementary manner to the first switching elements (T1 . . . T3) of each one half bridge when a sufficient minimum measurement duration ($T_M$) is provided during which the switching signals of switching elements (T1 . . . T6) of two half bridges of the plurality of half bridges are at different potentials;
otherwise:
generating pulse-width-modulated switching signals for the switching elements (T1 . . . T6) of the half bridges which deviate at least so far from being centered that a sufficient minimum measurement duration ($T_M$) is provided, wherein
forming, when at least two switching signals of the first switching elements (T1, T3, T5) have a defined largely different duty cycle and proportions of the switching signals change during a transition from one switching cycle to the next, the switching signals such that 1-shunt current measurements are, in each case, carried out at alternating edges of the switching signals; and
carrying out a 1-shunt current measurement within the minimum measurement duration ($T_M$) provided.

2. The method as claimed in claim 1, wherein when the switching signals of the first switching elements (T1, T3, T5) have a defined similar duty cycle, rising edges of the three switching signals of the first switching elements (T1, T3, T5), at which the 1-shunt current measurement is carried out, are fixed in their chronological sequence relative to one another and are formed in such a way that the minimum measurement duration ($T_M$) is provided between the switching signals of the first switching elements (T1, T3, T5), wherein the 1-shunt current measurement is carried out at rising edges of the switching signals of the first switching elements (T1, T3, T5) in the first half of the PWM period.

3. The method as claimed in claim 1, wherein when the switching signals of the first switching elements (T1, T3, T5) have a defined similar duty cycle, falling edges of the three switching signals of the first switching elements (T1, T3, T5), at which the 1-shunt current measurement is carried out, are fixed in their chronological sequence relative to one another and are formed in such a way that the minimum measurement duration ($T_M$) is provided between the switching signals of the first switching elements (T1, T3, T5), wherein the 1-shunt current measurement is carried out at falling edges of the switching signals of the first switching elements (T1, T3, T5) in the second half of the PWM period.

4. The method as claimed in claim 2, wherein the duty cycles of the three switching signals of the switching elements (T1, T3, T5) is similar and the difference in the duty cycles of the three switching signals is smaller than approximately 20% up to approximately 30%.

5. The method as claimed in claim 1, wherein the difference in the duty cycle is greater than approximately 25% up to approximately 100%.

6. The method as claimed in claim 1, wherein the method is carried out for a permanently excited or for a separately excited synchronous machine.

7. A device (200) for operating an electric synchronous machine, the device comprising:
- a generating means (210) for generating centered pulse-width-modulated switching signals for switching elements (T1 ... T6) of a plurality of half bridges, wherein in each case for each of the plurality of half bridges, a first switching element and a second switching element of the switching elements (T1 ... T6) are connected to one half bridge, wherein second switching elements (T4 ... T6) of each one half bridge of the plurality of half bridges are controlled in a complementary manner to first switching elements (T1 ... T3) of each one half bridge when a sufficient minimum measurement duration ($T_M$) is provided during which the switching signals of switching elements (T1 ... T6) of two half bridges of the plurality of half bridges are at different potentials,
- otherwise: for generating pulse-width-modulated switching signals for the switching elements (T1 ... T6) of the half bridges which deviate at least so far from being centered that a sufficient minimum measurement duration ($T_M$) is provided;
- wherein, by means of the generating means (210), when at least two switching signals of the first switching elements (T1, T3, T5) have a defined largely different duty cycle and proportions of the switching signals change during a transition from one switching cycle to the next, the switching signals are formed such that 1-shunt current measurements are, in each case, carried out at alternating edges of the switching signals; and
- a measuring means (220) for carrying out a 1-shunt current measurement, wherein, by means of the switching signals of the switching elements (T1 ... T6), a defined minimum measurement duration ($T_M$) is provided during which two switching signals of a half bridge are at different potentials.

8. A non-transitory, computer-readable medium containing machine-readable instructions that when executed by a computer cause the computer to operate an electric synchronous machine (200) by generating centered pulse-width-modulated switching signals for switching elements (T1 ... T6) of a plurality of half bridges, wherein in each case for each of the plurality of half bridges, a first switching element and a second switching element of the switching elements (T1 ... T6) are connected to one half bridge, wherein the second switching elements (T4 ... T6) of each one half bridge are controlled in a complementary manner to first switching elements (T1 ... T3) of each one half bridge when a sufficient minimum measurement duration ($T_M$) is provided during which the switching signals of switching elements (T1 ... T6) of two half bridges of the plurality of half bridges are at different potentials;

otherwise:

generating pulse-width-modulated switching signals for the switching elements (T1 ... T6) of the half bridges which deviate at least so far from being centered that a sufficient minimum measurement duration ($T_M$) is provided, wherein the switching signals of the switching elements (T1 ... T6) are formed when at least two switching signals of the first switching elements (T1, T3, T5) have a defined largely different duty cycle and proportions of the switching signals change during a transition from one switching cycle to the next such that 1-shunt current measurements are, in each case, carried out at alternating edges of the switching signals; and carrying out a 1-shunt current measurement within the minimum measurement duration ($T_M$) provided.

9. The method of claim 1, the method further comprising, when the 1-shunt current measurement on a positive switching edge and two switching signals from different switching elements (T1, T2, T3) have a similar duty cycle, shifting the switching signal of the switching element (T1, T2, T3) with a larger duty cycle to the left, and shifting the switching signal of the switching element (T1, T2, T3) with a smaller duty cycle to the right.

10. The method of claim 1, the method further comprising, when the 1-shunt current measurement on a negative switching edge and two switching signals from different switching elements (T1, T2, T3) have a similar duty cycle, shifting the switching signal of the switching element (T1, T2, T3) with a larger duty cycle to the right, and shifting the switching signal of the switching element (T1, T2, T3) with a smaller duty cycle to the left.

* * * * *